United States Patent
Chen et al.

(10) Patent No.: US 10,201,887 B2
(45) Date of Patent: Feb. 12, 2019

(54) POLISHING PAD HAVING GROOVES ON BOTTOM SURFACE OF TOP LAYER

(71) Applicant: Taiwan Semiconductor Manufacturing Co., Ltd., Hsinchu (TW)

(72) Inventors: Chih-Hung Chen, Hsinchu (TW); Kei-Wei Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 47 days.

(21) Appl. No.: 15/473,967

(22) Filed: Mar. 30, 2017

(65) Prior Publication Data

US 2018/0281150 A1 Oct. 4, 2018

(51) Int. Cl.
| | |
|---|---|
| *B24B 37/26* | (2012.01) |
| *B24B 37/22* | (2012.01) |
| *B24B 37/04* | (2012.01) |
| *H01L 21/67* | (2006.01) |
| *H01L 21/683* | (2006.01) |

(52) U.S. Cl.
CPC ............ *B24B 37/26* (2013.01); *B24B 37/042* (2013.01); *B24B 37/22* (2013.01); *H01L 21/67063* (2013.01); *H01L 21/6838* (2013.01)

(58) Field of Classification Search
CPC ......... B24B 37/26; B24B 37/22; B24B 37/04; H01L 21/67063; H01L 21/6838
USPC ................................. 451/526, 527, 533, 534
See application file for complete search history.

(56) References Cited

U.S. PATENT DOCUMENTS

| | | | | |
|---|---|---|---|---|
| 5,725,420 A | * | 3/1998 | Torii | ....................... B24B 37/26 451/285 |
| 2004/0259479 A1 | * | 12/2004 | Sevilla | ...................... B23H 5/08 451/41 |
| 2012/0009855 A1 | * | 1/2012 | Allison | .................. B24B 37/205 451/527 |
| 2013/0012107 A1 | * | 1/2013 | Kazuno | .................... B24B 37/22 451/41 |

* cited by examiner

*Primary Examiner* — Robert Rose (74) *Attorney, Agent, or Firm* — McClure, Qualey & Rodack, LLP (57) ABSTRACT

A polishing pad is provided. The polishing pad includes a base layer, a top layer, and multiple grooves. The top layer is located over the base layer and has a polishing surface and a bottom surface opposite to each other. The bottom surface is connected to the base layer. The grooves are formed on the bottom surface of the top layer.

20 Claims, 12 Drawing Sheets

POLISHING PAD HAVING GROOVES ON BOTTOM SURFACE OF TOP LAYER

BACKGROUND

Chemical Mechanical Polishing (CMP) is one type of process used in the manufacture of semiconductor devices. CMP is a process used to smooth and planarize the surfaces of wafers using a combination of chemical and mechanical forces. Integrated circuit (IC) dies in wafer form are placed into a chamber of a CMP apparatus and are planarized or polished at various stages of a manufacturing process. CMP processes may be used to form planar surfaces on dielectric layers, semiconductor layers, and conductive material layers of a wafer, for example.

CMP apparatuses typically have a rotatable platen with a polishing pad attached thereto. In some CMP processes, a semiconductor wafer is placed upside down against the polishing pad using a predetermined amount of pressure. A liquid dispersion referred to as slurry that contains chemicals and microabrasive grains is applied to the polishing pad during the CMP process while the wafer is held against the rotating polishing pad. The wafer is also rotated in some applications.

Although existing devices and methods for a CMP process have been generally adequate for their intended purposes, they have not been entirely satisfactory in all respects. Consequently, it would be desirable to provide a solution for polishing wafers in CMP apparatuses.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Chemical Mechanical Polishing (CMP) apparatus is provided in accordance with various exemplary embodiments. The variations of some embodiments are discussed. Throughout the various views and illustrative embodiments, like reference numbers are used to designate like elements. The embodiments of the present disclosure also include the scope of using the CMP apparatus in accordance with the embodiments to manufacture integrated circuits. For example, the CMP apparatus is used to planarize and polish wafers, in which integrated circuits are formed, on a polishing pad by a CMP process.

Figure 1:
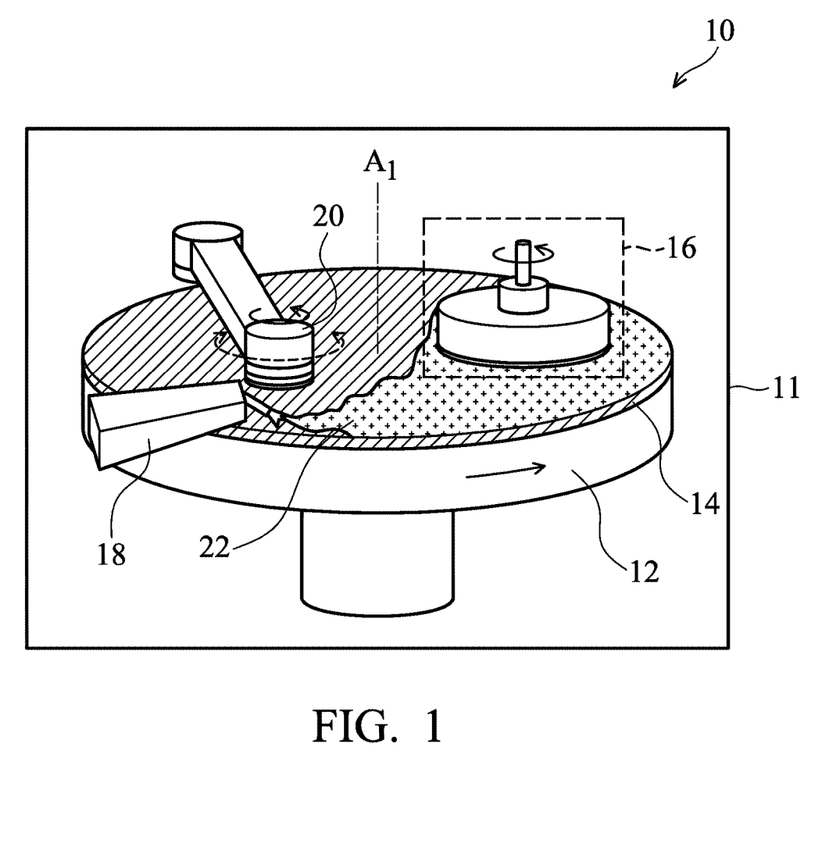
FIG. 1 is a schematic view of a Chemical Mechanical Polishing (CMP) apparatus in accordance with some embodiments.

FIG. 1 schematically illustrates a perspective view of a part of a CMP apparatus 10 in accordance with some embodiments of the present disclosure. The CMP apparatus 10 includes a housing 11 which provides a sealed, contained system for the components of the CMP apparatus 10 as described below. One or more load ports (not shown) are coupled to the housing 11 for allowing a wafer or wafers to enter and exit the CMP apparatus 10. The wafers may be production wafers or test wafers, for example. In some embodiments, the wafer has a diameter in a range from about 200 mm to about 600 mm. For example, the wafer may have a diameter of about 300 mm or 450 mm.

As shown in FIG. 1, the CMP apparatus 10 includes a polishing platen 12, a polishing pad 14 over the polishing platen 12, and a polishing head 16 over the polishing pad 14. A slurry dispenser 18 has an outlet directly over the polishing pad 14 in order to dispense slurry 22 onto the polishing pad 14. A disk 20 is also placed over the polishing pad 14.

During the CMP process, the slurry 22 is dispensed by the slurry dispenser 18 onto the polishing pad 14. In some embodiments, the slurry dispenser 18 is attached to a tank or reservoir (not shown) that holds a supply of the slurry 22. The slurry dispenser 18 may comprise a nozzle on the end of a pivotable arm, so that the slurry dispenser 18 can be moved towards or away from the polishing pad 14. The slurry 22 includes reactive chemicals that react with the surface of the wafer. Furthermore, the slurry 22 includes abrasive particles for mechanically polishing the wafer.

The polishing pad 14 is formed of a material that is hard enough to allow the abrasive particles in the slurry 22 to mechanically polish the wafer, which is under the polishing head 16. On the other hand, the polishing pad 14 is also soft enough so that it does not substantially scratch the wafer. The polishing pad 14 is removable and is attachable to the polishing platen 12 by an adhesive film, adhesive, or glue in some embodiments. During the CMP process, the polishing platen 12 is rotated by a mechanism, such as motor (not shown), and hence the polishing pad 14 fixed thereon is also rotated along with the polishing platen 12.

During the CMP process, the polishing head 16 is also rotated, causing the rotation of the wafer affixed to the polishing head 16. In accordance with some embodiments, as shown in FIG. 1, the polishing head 16 and the polishing pad 14 rotate in the same direction (clockwise or counter-clockwise). In accordance with alternative embodiments, the polishing head 16 and the polishing pad 14 rotate in opposite directions. With the rotation of the polishing pad 14 and the polishing head 16, the slurry 22 flows between the wafer and the polishing pad 14 through surface grooves S (FIG. 6) on the (polishing) surface of the polishing pad 14. Through the chemical reaction between the reactive chemicals in the slurry 22 and the surface of the wafer, and further through the mechanical polishing, the surface of the wafer is planarized. The polishing head 16 includes or is coupled to a mechanism (not shown) that is adapted to move and rotate the polishing head 16.

FIG. 1 also illustrates a disk 20 placed over the polishing pad 14. The disk 20 is configured to remove undesirable by-products during the CMP process. In accordance with some embodiments, the disk 20 is a diamond disk which includes embedded or encapsulated cut diamond particles on a substrate. In addition, the disk 20 comes into contact with the surface of the polishing pad 14 when the polishing pad 14 is to be conditioned. During the conditioning, both the polishing pad 14 and the disk 20 rotate, so that the protrusions or cutting edges of the disk 20 move relative to the surface of the polishing pad 14, thereby polishing and re-texturizing the surface of the polishing pad 14. The disk 20 includes or is coupled to a mechanism (not shown) that is adapted to move and rotate the disk 20.

Components of the CMP apparatus 10 relevant to the present disclosure are illustrated in FIG. 1, but the CMP apparatus 10 may also include other components that are not shown. For example, the CMP apparatus 10 may also include a liquid dispenser in order to dispense a washing liquid, such as de-ionized water (DI water), onto the surface of the polishing pad 14, so that the particles and the slurry 22 that remain on the surface of the polishing pad 14 after the CMP process are washed away. Furthermore, the CMP apparatus 10 may also include stations other than the polishing station, such as a cleaning station, a drying station, or another type of station. After the CMP process, the wafer can be cleaned through a post-CMP cleaning process in the cleaning station and dried through a drying process in the drying station.

Figure 2:
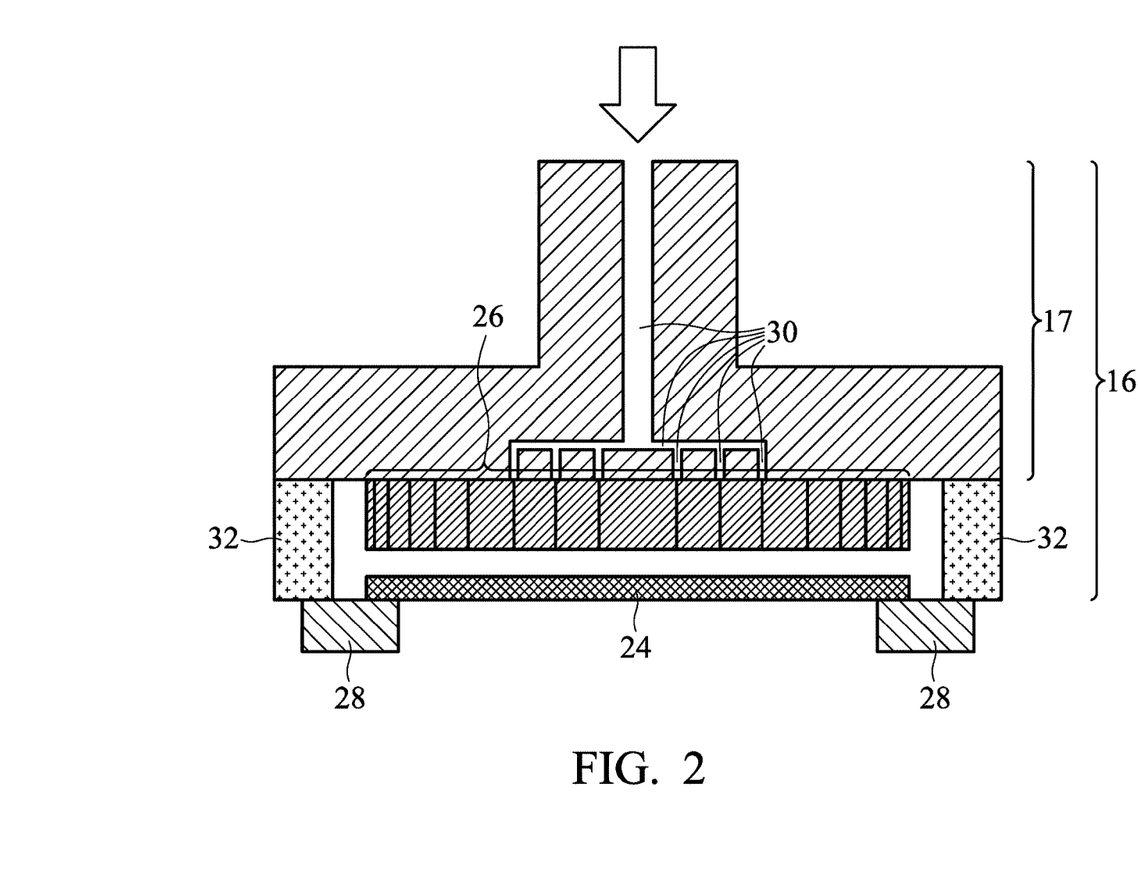
FIG. 2 is a cross-sectional view illustrating an intermediate stage of a CMP process in accordance with some embodiments.

FIGS. 2 to 5 are cross-sectional views illustrating intermediate stages of a CMP process in accordance with some embodiments. Referring to FIG. 2, a polishing head 16 is provided. The polishing head 16 includes a wafer carrier 17, which is configured to hold and fix a wafer 24 in various steps. The wafer carrier 17 includes multiple air passages 30, in which a vacuum may be generated. By vacuuming the air passages 30, the wafer 24 is sucked up for the transportation of the wafer 24 to and away from the polishing pad 14 (FIG. 1). As shown in FIG. 2, the polishing head 16 is moved over the wafer 24, which is placed over a wafer stage 28. The wafer stage 28 provided in the housing 11 is not illustrated in FIG. 1.

Figure 3:
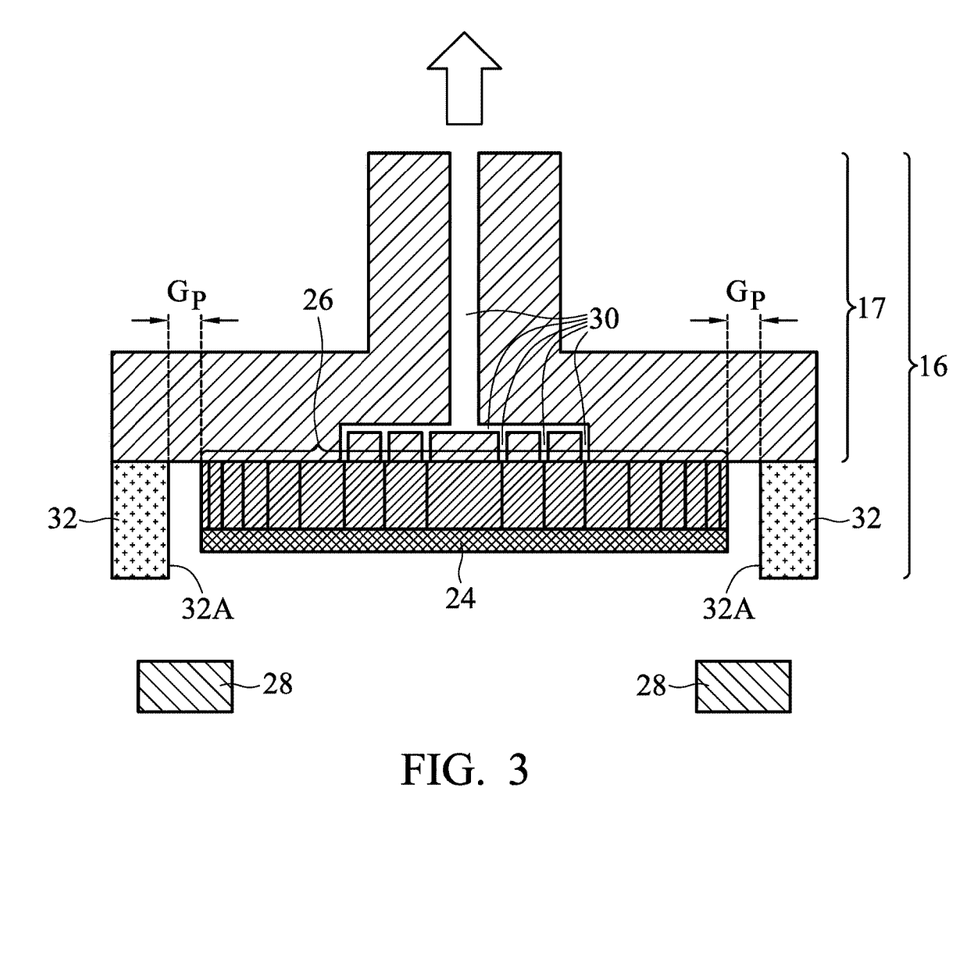
FIG. 3 is a cross-sectional view illustrating an intermediate stage of a CMP process in accordance with some embodiments.

Next, referring to FIG. 3, a vacuum is generated in the air passages 30, and the wafer 24 is picked up. Although not shown in FIG. 3, the air passages 30 also include some portions in a flexible membrane 26 attached to the wafer carrier 17, and hence when the wafer 24 is picked up, the bottom surface of the flexible membrane 26 comes into contact with the top surface of the wafer 24. In accordance with some embodiments, the flexible membrane 26 is formed of a flexible and elastic material. For example, the flexible membrane 26 is formed of ethylene propylene rubber, neoprene rubber, nitrile rubber, or the like.

As shown in FIG. 3, the picked-up wafer 24 is located in the space defined by a retaining ring 32 (a circular ring) which is provided on the bottom surface of the wafer carrier 17. When picking up the wafer 24, the central axis of the polishing head 16 is aligned with the center of the wafer 24, so that the edges of the wafer 24 may be equally spaced from the respective inner edges 32A of the retaining ring 32 by gaps Gp.

Figure 4:
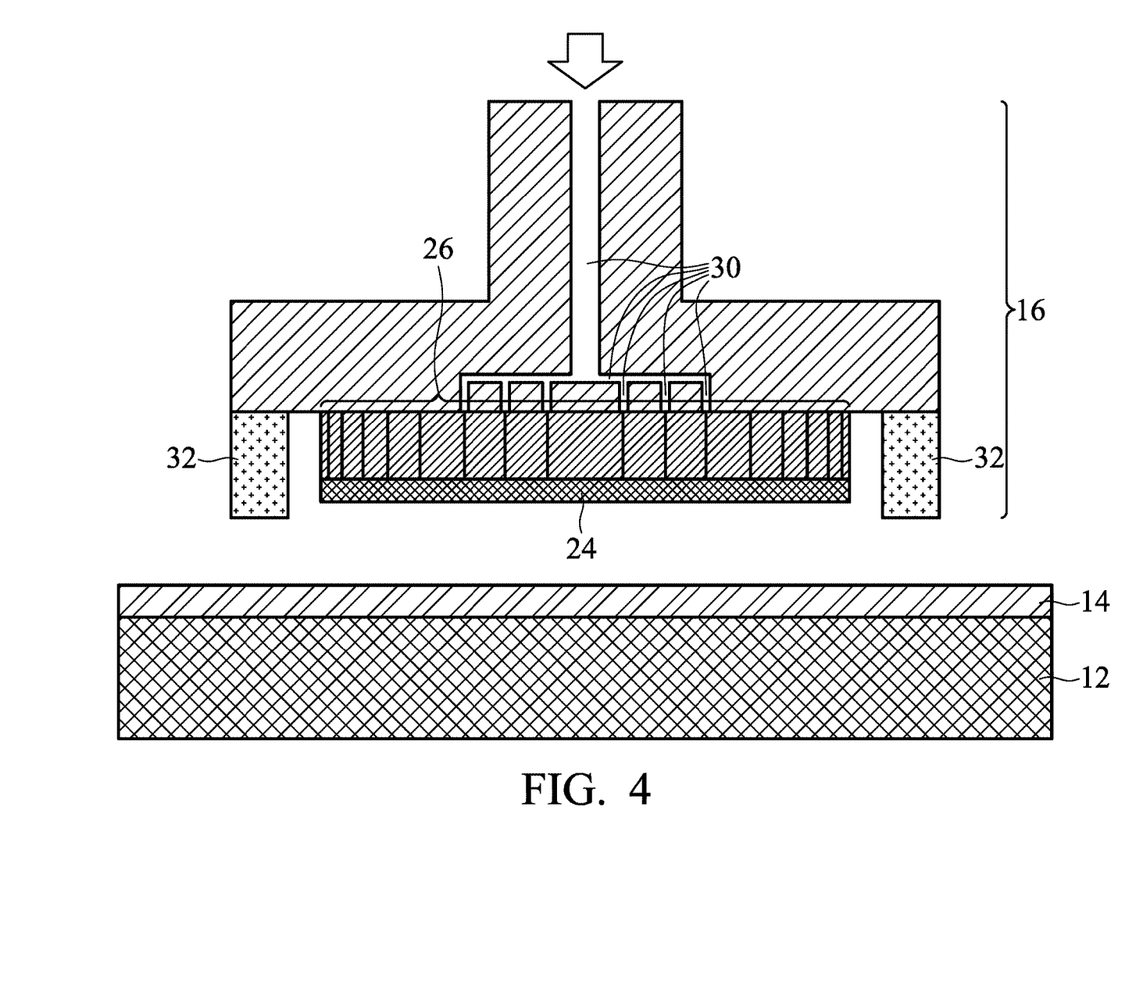
FIG. 4 is a cross-sectional view illustrating an intermediate stage of a CMP process in accordance with some embodiments.

Referring to FIG. 4, the polishing head 16 is moved over the polishing pad 14, which is further located over the polishing platen 12. In accordance with some embodiments, the illustrated portion of the polishing pad 14 is not the center portion of the polishing pad 14. Rather, as illustrated in FIG. 1, the illustrated portion is offset from the central axis A1 of the polishing pad 14. For example, the central axis A1 of the polishing pad 14, along with rotation of the polishing pad 14, may be on the left side or the right side of the illustrated portion in FIG. 4.

Figure 5:
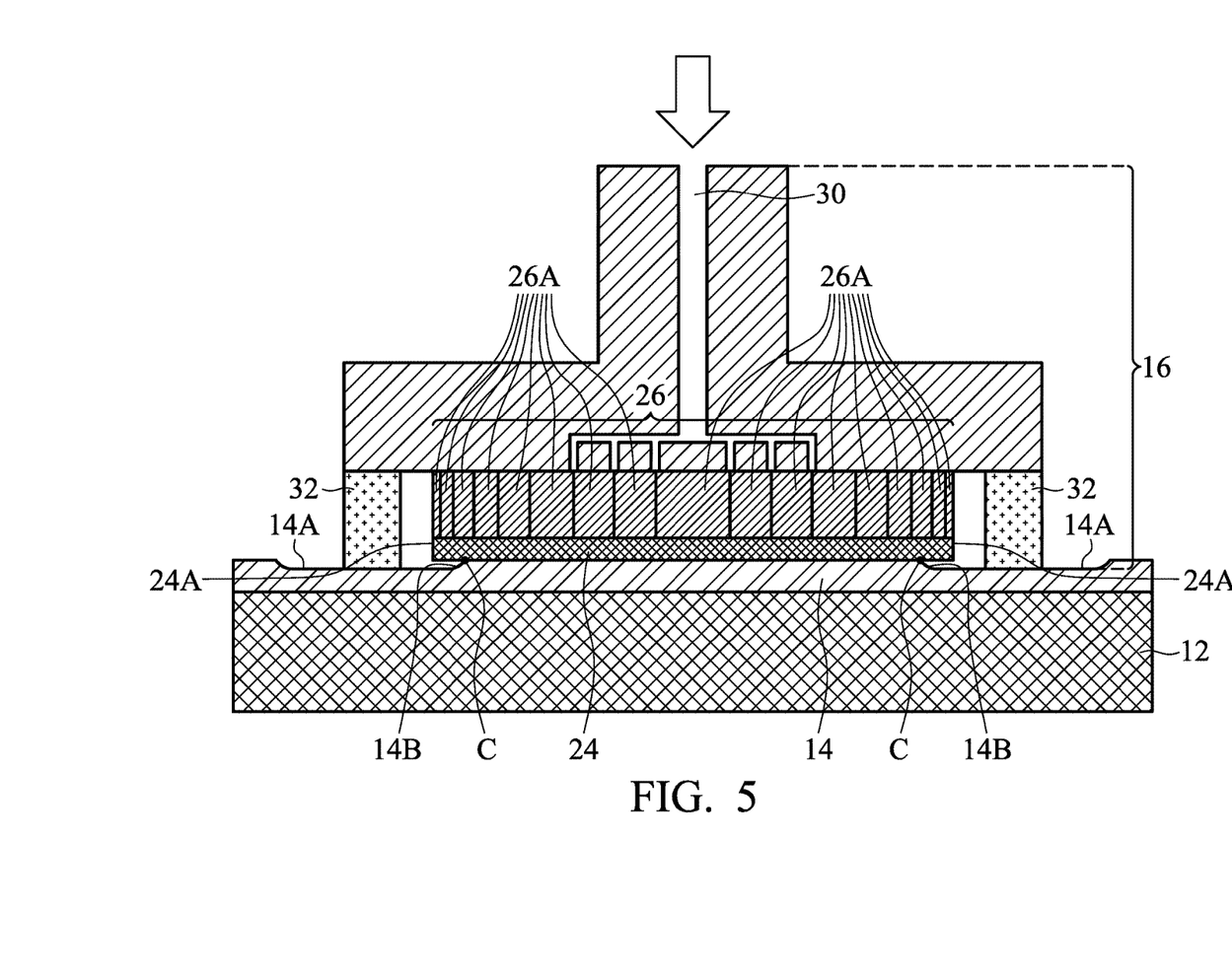
FIG. 5 is a cross-sectional view illustrating an intermediate stage of a CMP process in accordance with some embodiments.

Next, referring to FIG. 5, the polishing head 16 is placed on, and also pressed against, the polishing pad 14. The vacuuming in the air passages 30 is then turned off, and hence the wafer 24 is no longer sucked up. Afterwards, the flexible membrane 26 is inflated, for example, by pumping air into the plurality of zones 26A in the flexible membrane 26, and hence the inflated flexible membrane 26 presses the wafer 24 against the polishing pad 14.

When the polishing head 16 is pressed against the polishing pad 14 by a mechanism (not shown), the bottom surface of the retaining ring 32 is in physical contact with, and is pressed against, the polishing pad 14. While not shown, the bottom surface of the retaining ring 32 has some grooves, which allow the slurry 22 (FIG. 1) to get in and out of the retaining ring 32 during the rotation of the polishing head 16 (and the retaining ring 32). In accordance with some embodiments, the retaining ring 32 is formed of a wear-resistant material, which may be plastic, ceramic, polymer, etc. For example, the retaining ring 32 is formed of polyphenylene sulfide (PPS), polyetheretherketone (PEEK) or a mix of these materials and other materials such as polymers (for example, polyurethane, polyester, polyether, or polycarbonate).

With the wafer 24 pressed against the polishing pad 14, the polishing pad 14 and the polishing head 16 rotate, resulting in the rotation of the wafer 24 on the polishing pad 14, and hence the CMP process is conducted. During the CMP process, the retaining ring 32 functions to retain the wafer 24 in case the wafer 24 becomes offset from the central axis of the polishing head 16, so that the wafer 24 is not spun off from the polishing pad 14.

As shown in FIG. 5, when the retaining ring 32 is pressed against the polishing pad 14, the retaining ring 32 causes the adjacent part of the polishing pad 14 to deform. The part 14A of the polishing pad 14 below and immediately next to the retaining ring 32 may recess, and the part 14B of the polishing pad 14 next to the recessed part 14A may protrude (or rebound). Moreover, the rebounded part 14B next to the inner edge of the retaining ring 32 may come into contact with the edge region of the bottom surface of the wafer 24. The contact locations of the polishing pad 14 and the wafer 24 closest to the wafer edge 24A (or the rebounded location of the polishing pad 14) are indicated by letters C in FIG. 5.

In general, the edge region of the bottom surface of the wafer 24 is less prone to coming into contact with the polishing pad 14, so that the edge region of the wafer 24 typically has a lower CMP rate (i.e. removal rate) than the central region. The rebound phenomenon of the polishing pad 14 described above helps to compensate for such non-uniformity in the removal rate, thereby improving the removal rate uniformity of the whole wafer 24 using the CMP process.

In addition, the rebounded locations C (FIG. 5) of the polishing pad 14 are related to the stiffness thereof. If the stiffness of the polishing pad 14 is greater, the rebounded locations C may be closer to the central region of the wafer 24. If the stiffness of the polishing pad 14 is lower, the rebounded locations C may be closer to the wafer edge 24A.

Accordingly, the lower the stiffness of the polishing pad 14, the better the removal rate uniformity of the whole wafer 24 since the rebounded locations C are closer to the wafer edge 24A. However, when the stiffness of the polishing pad 14 is lower, the CMP planarity is reduced (i.e. both the highs and low spots on the wafer surface are removed). On the other hand, when the stiffness of the polishing pad 14 is greater, the CMP planarity is increased (i.e. the high spots on the wafer surface are removed while the low spots are not removed), but the removal rate uniformity of the whole wafer 24 is reduced.

Figure 6:
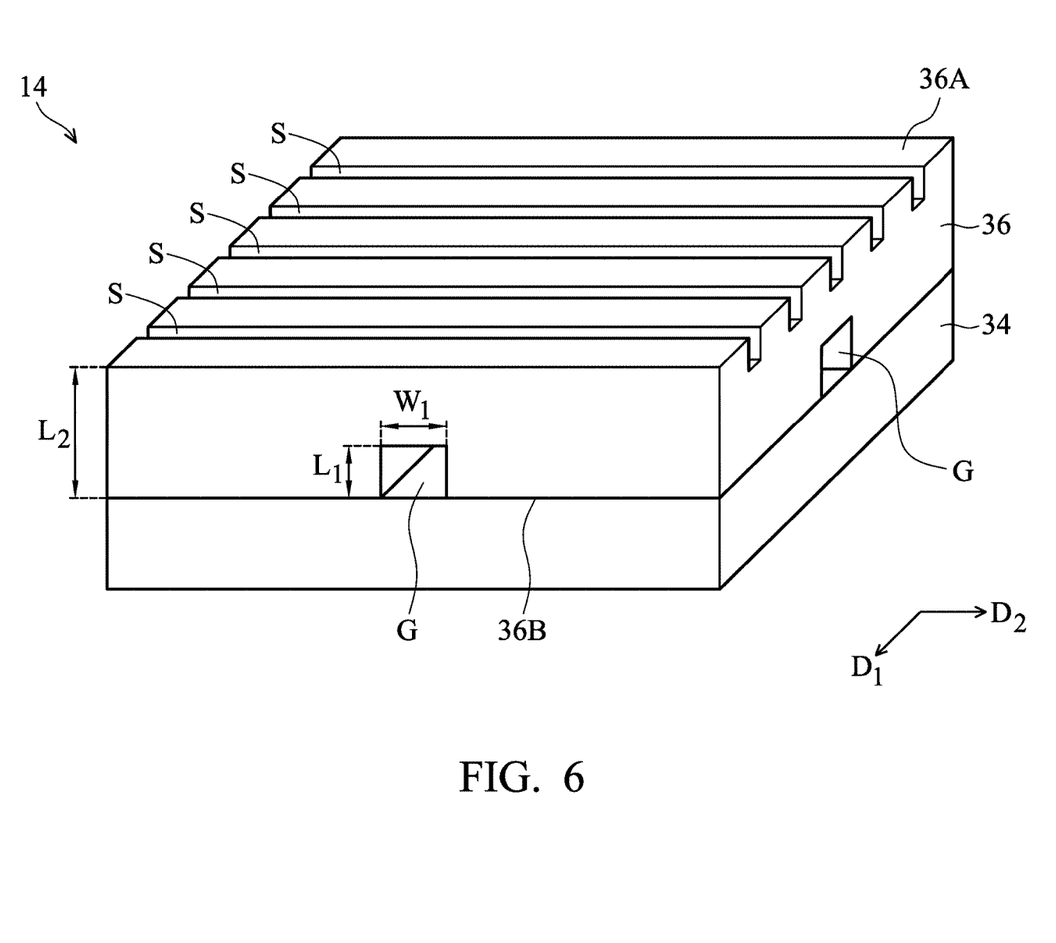
FIG. 6 is a perspective view illustrating a portion of a polishing pad in accordance with some embodiments.
Figure 7:
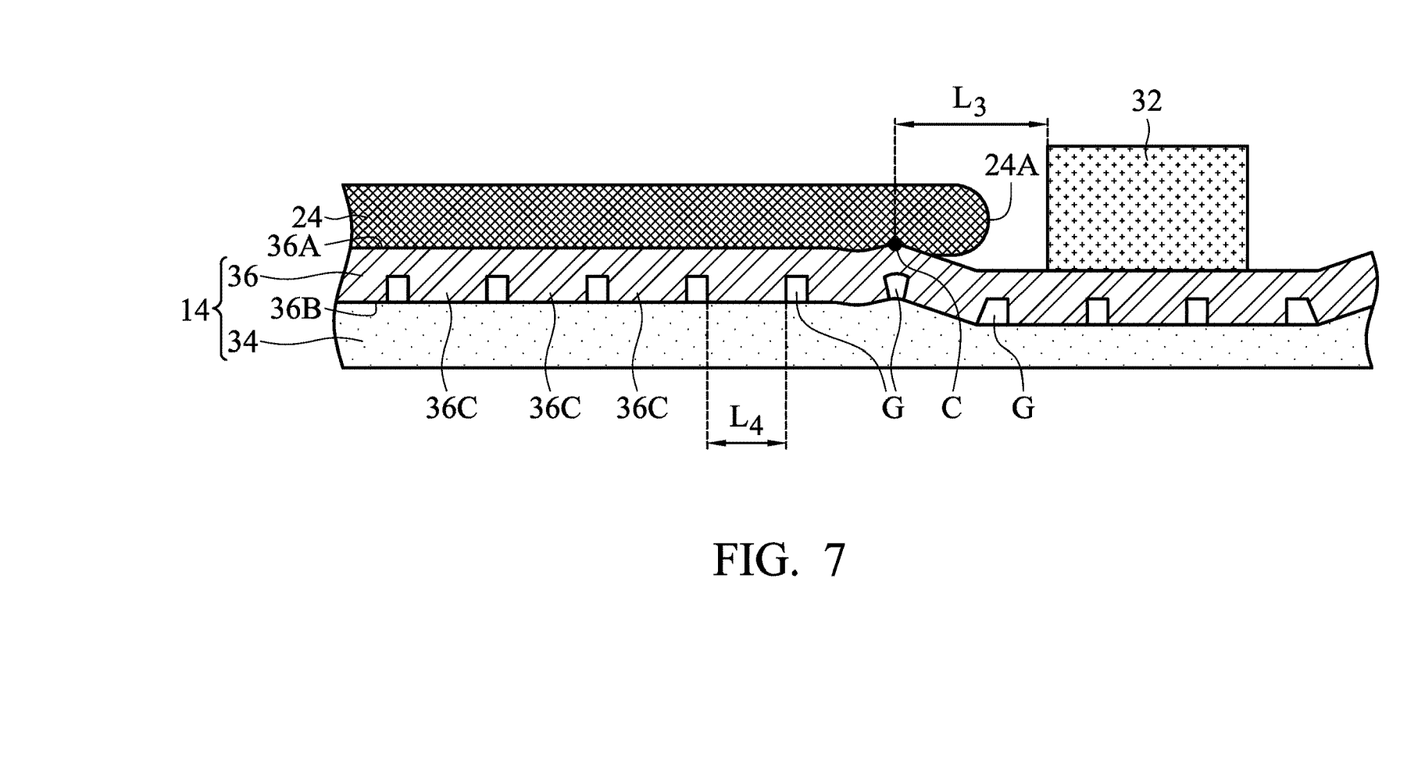
FIG. 7 is a schematic view illustrating that the rebounded location of the polishing pad is moved closer to the wafer edge.

The mechanism of the improvement in the removal rate uniformity and the CMP planarity of the whole wafer 24 is explained in FIGS. 6 and 7.

Referring to FIG. 6, which is a perspective view illustrating a portion of a polishing pad 14 in accordance with some embodiments. The polishing pad 14 includes a base layer 34 and a top layer 36 over the base layer 34. The base layer 34 is configured to be attached to the polishing platen 12 (FIG. 5). The top layer 36 has a polishing surface 36A and a bottom surface 36B opposite to each other, and the bottom surface 36B is connected to the base layer 34 by, for example, an adhesive. The polishing surface 36A has multiple surface grooves S formed thereon, and the wafer 24 (FIG. 5) is pressed against the polishing surface 36A during the CMP process as described above.

In accordance with some embodiments, the material of the top layer 36 is harder than that of the base layer 34. For example, the top layer 36 is formed of a wear-resistant material, such as polyurethane or other polymers. The base layer 34 comprises a material may comprise a felt material or a high porosity polymer foam.

As shown in FIG. 6, multiple grooves G are formed on the bottom surface 36B of the top layer 36 of the polishing pad 14. The grooves G extend in a first direction D1 and a second direction D2 which are different from each other, for example. Accordingly, the bottom surface 36B of the top layer 36 are separated into multiple portions P (FIG. 8A) by the grooves G.

In accordance with some embodiments, the depth of the grooves G is about one half of the thickness of the top layer 36. For example, the top layer 36 may have a thickness L2 in a range from about 2 mm to about 3 mm, and the grooves G may have a depth L1 in a range from about 1 mm to about 1.5 mm. The top layer 36 and the grooves G may also have other thickness and depth ranges. In addition, the grooves G may have a width W1 in a range from about 0.3 mm to about 0.5 mm.

Referring to FIG. 7, which is a schematic view illustrating that the rebounded location C of the polishing pad 14 is moved closer to the wafer edge 24A. By forming the grooves G on the bottom surface 36B of the top layer 36, the top layer 36 is broken into multiple individual, connected islands 36C, so that the stiffness of the top layer 36 (and the polishing pad 14) is reduced. Accordingly, the rebounded location C of the polishing pad 14 can be moved closer to the wafer edge 24A.

For example, if no groove G is formed on the bottom surface 36B of the top layer 36, the distance L3 between the rebounded location C of the polishing pad 14 and the wafer edge 24A may be in a range from about 3 mm to 5 mm; whereas, if the grooves G are formed on the bottom surface 36B of the top layer 36, the distance L3 between the rebounded location C of the polishing pad 14 and the wafer edge 24A may be reduced to less than 3 mm (for example, between about 1 mm and about 2 mm).

As described above, the removal rate uniformity of the whole wafer 24 is thus increased since the rebounded location C of the polishing pad 14 is moved closer to the wafer edge 24A.

In accordance with some embodiments, the distance L4 between the grooves G may be in a range from about 2 mm to about 10 mm. It should be realized that, if the distance L4 is shorter within the above range, the stiffness of the top layer 36 (and the polishing pad 14) is reduced and the rebounded location C of the polishing pad 14 is moved closer to the wafer edge 24A accordingly; whereas, if the distance L4 is longer within the above range, the stiffness of the top layer 36 (and the polishing pad 14) is increased and the rebounded location C of the polishing pad 14 is moved further away from the wafer edge 24A accordingly. Optimizing the rebounder location C is used to improve the removal rate uniformity of the whole wafer 24. The distance L4 between the grooves G may also have other ranges according to actual requirements (for example, the change in material of the slurry or polishing pad, which can shift the removal profile at the edge region of the wafer).

Furthermore, within each of the islands 36C, the top layer 36 (and the polishing pad 14) has the same (great) stiffness as before, and hence the CMP planarity is maintained.

As a result, both the removal rate uniformity and the CMP planarity of the whole wafer 24 are improved by forming the grooves G on the bottom surface 36B of the top layer 36 of the polishing pad 14 to reduce the stiffness of the whole top layer 36 (and the polishing pad 14) while the stiffness of the local islands 36C of the top layer 36 is maintained. In addition, as the surface grooves S on the polishing surface 36A of the top layer 36 are unchanged, the variations in the CMP effect are minimized.

Figure 8A:
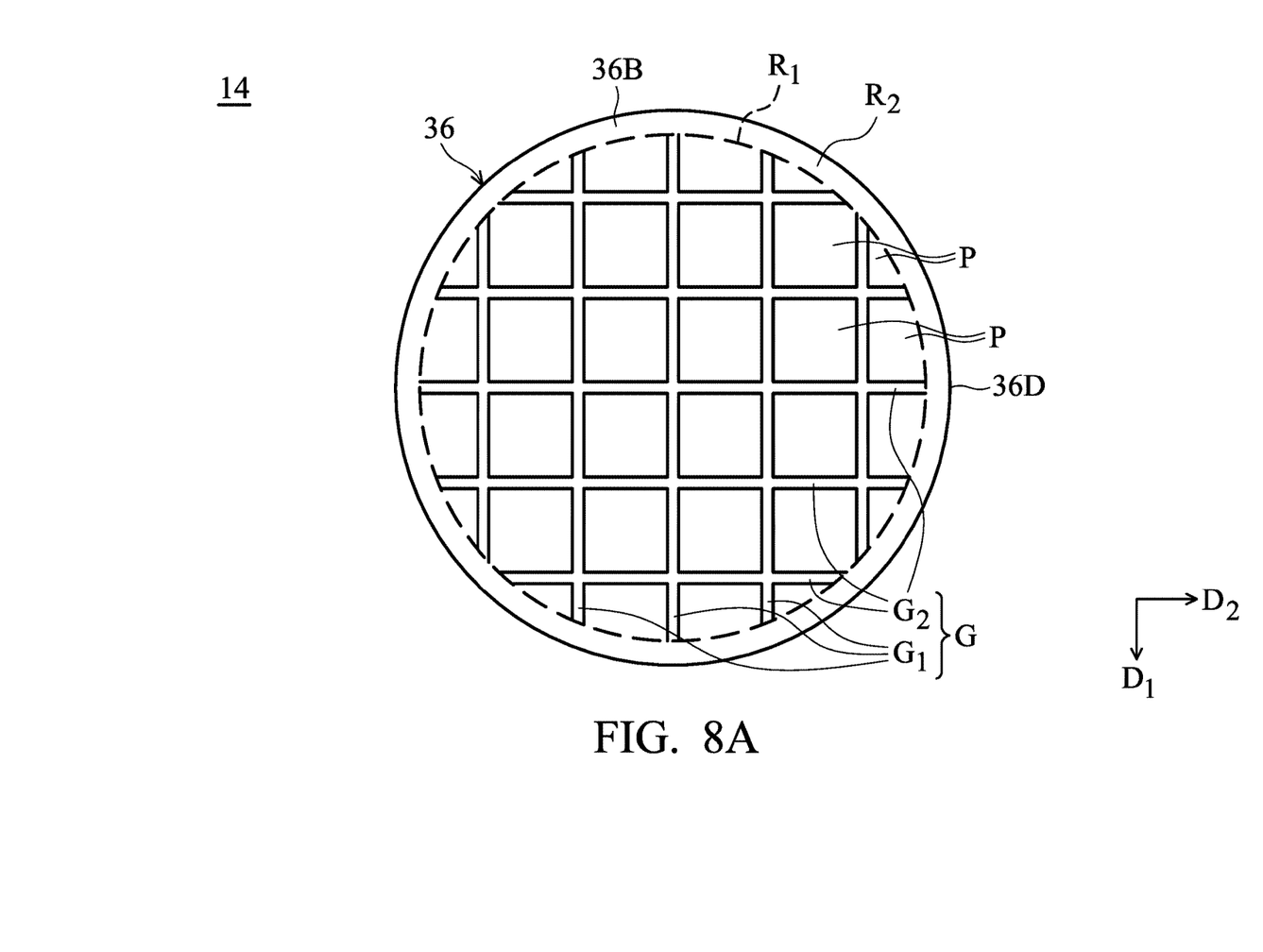
FIG. 8A is a plane view illustrating the arrangement of the grooves on the bottom surface of the top layer of a polishing pad in accordance with some embodiments.
Figure 8B:
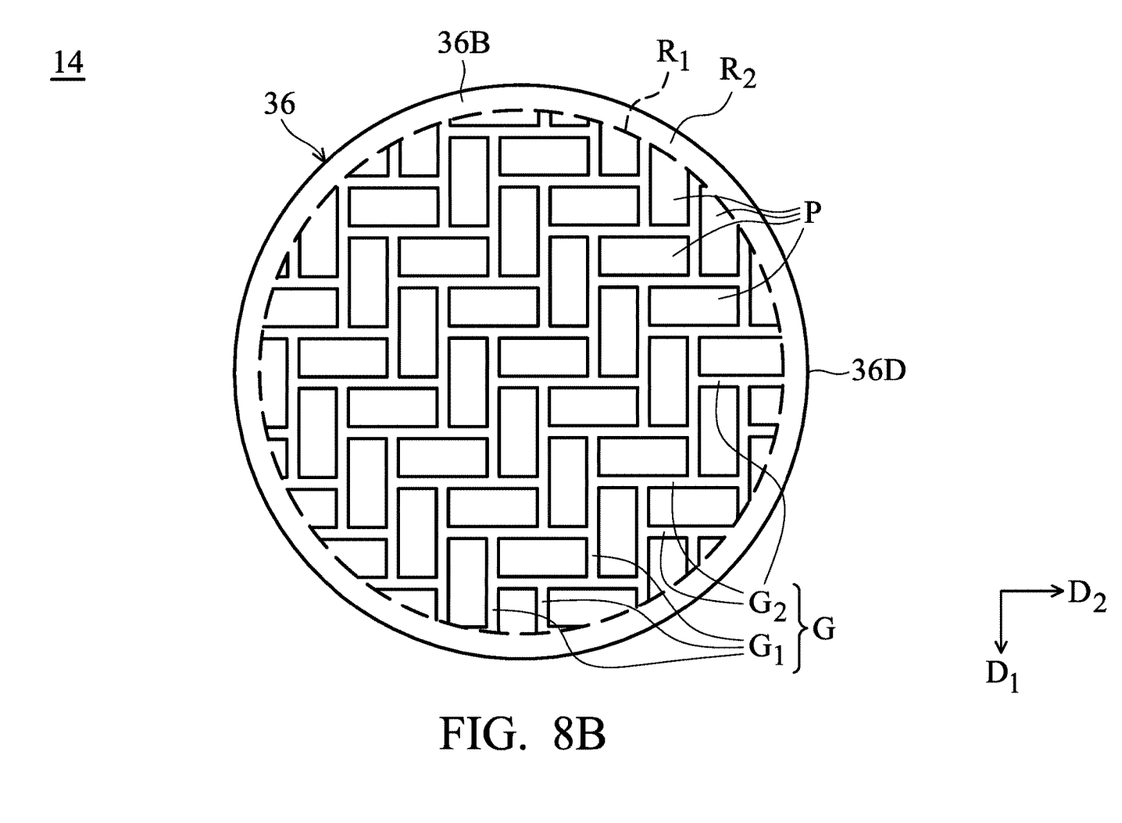
FIG. 8B is a plane view illustrating the arrangement of the grooves on the bottom surface of the top layer of a polishing pad in accordance with some embodiments.
Figure 8C:
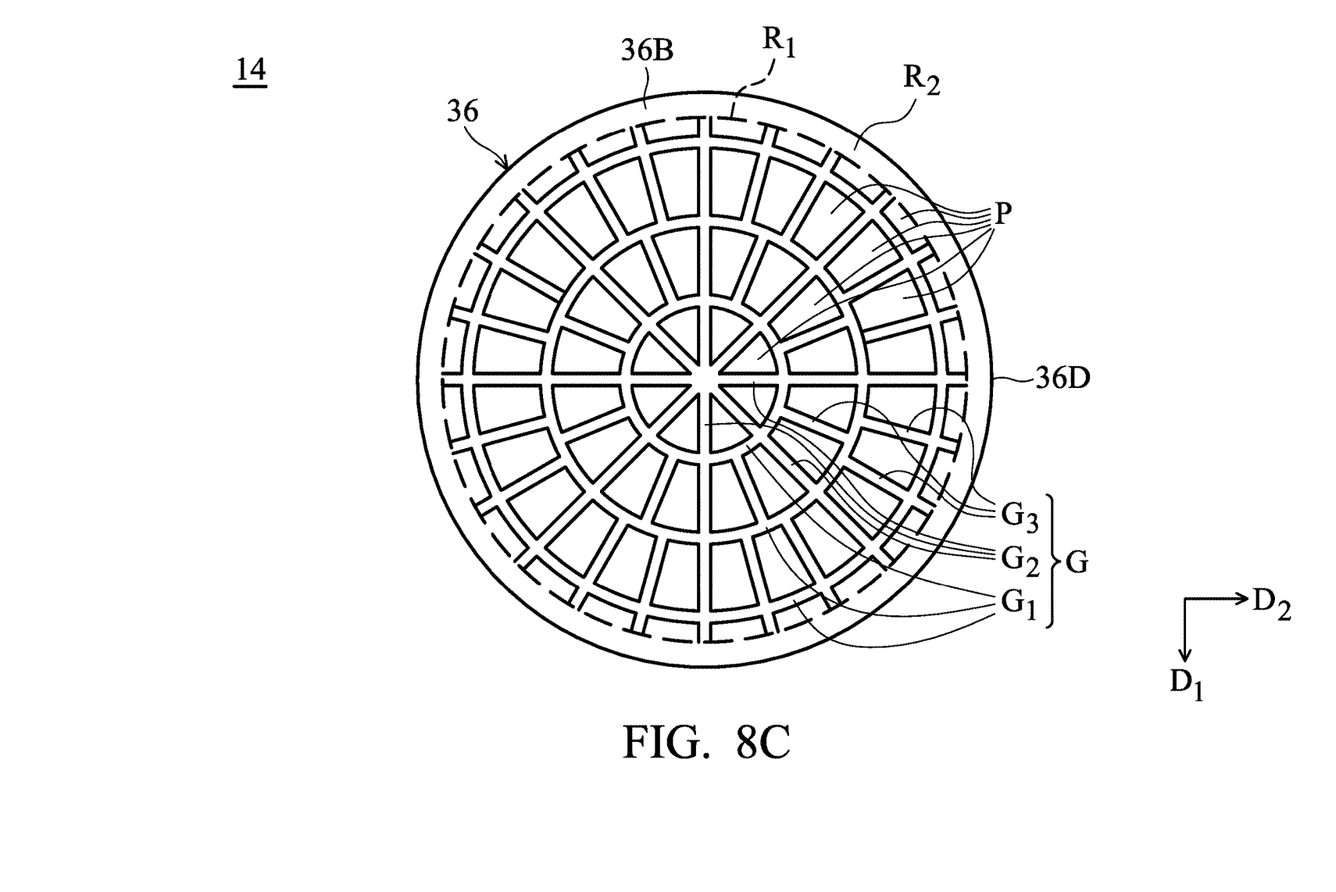
FIG. 8C is a plane view illustrating the arrangement of the grooves on the bottom surface of the top layer of a polishing pad in accordance with some embodiments.

FIGS. 8A to 8C are plane views illustrating the arrangement of the grooves G on the bottom surface 36B of the top layer 36 of a polishing pad 14 in accordance with some embodiments.

Referring to FIG. 8A, the bottom surface 36B of the (circular) top layer 36 includes a central region R1 (depicted as a dashed line) and an edge region R2 surrounding the central region R1. The grooves G are evenly distributed in the central region R1. More specifically, the grooves G includes multiple first grooves G1 extending in a first direction D1 and multiple second grooves G2 extending in a second direction D2 that is perpendicular to the first direction D1. The first grooves G1 and the second grooves G2 cross over each other.

With the above arrangement, the bottom surface 36B of the top layer 36 is separated into multiple portions P by the grooves G, and hence the top layer 36 is broken into multiple individual, connected islands 36C (FIG. 7). The portions P of the bottom surface 36B correspond to the islands 36C. In addition, in the central region R1 of the bottom surface 36B, the grooves G form multiple enclosing portions P with a square shape and having substantially the same dimensions, so that the islands 36C (FIG. 7) of the top layer 36 may also have the same stiffness. Accordingly, the removal rate uniformity of the whole wafer 24 (FIG. 7) using the polishing pad 14 in FIG. 8A is improved.

As shown in FIG. 8A, each of the first and second grooves G1 and G2 has a length that is less than the diameter of the top layer 36, so that the ends of the first and second grooves G1 and G2 are separated from the periphery 36D of the bottom surface 36B by a distance. The first and second grooves G1 and G2 terminating before the periphery 36D of the bottom surface 36B can keep liquid (for example, the slurry) out of the interface between the top layer 36 and the base layer 34 (FIG. 7), and hence the quality and lifespan of the polishing pad 14 are maintained.

Referring to FIG. 8B, the embodiments shown differ from the embodiments shown in FIG. 8A in that the first grooves G1 and the second grooves G2 intersect, but do not cross over each other. With the arrangement of the grooves G in FIG. 8B, the bottom surface 36B of the top layer 36 is separated into multiple portions P by the grooves G, and hence the top layer 36 is broken into multiple individual, connected islands 36C (FIG. 7). The portions P of the bottom surface 36B correspond to the islands 36C. In addition, in the central region R1 of the bottom surface 36B, the grooves G form multiple enclosing portions P with a rectangular shape and having substantially the same dimensions, so that the islands 36C (FIG. 7) of the top layer 36 may also have the same stiffness. Accordingly, the removal rate uniformity of the whole wafer 24 (FIG. 7) using the polishing pad 14 in FIG. 8B is improved.

Furthermore, as shown in FIG. 8B, the first and second grooves G1 and G2 terminating before the periphery 36D of the bottom surface 36B can keep liquid (for example, the slurry) out of the interface between the top layer 36 and the base layer 34 (FIG. 7), and hence the quality and lifespan of the polishing pad 14 are maintained.

The first direction D1 and the second direction D2 are not limited to being perpendicular to each other, as shown in FIGS. 8A and 8B. The first direction D1 and the second direction D2 may also be different from each other and have two angles therebetween. In some embodiments, the grooves G can further include multiple additional grooves extending in at least one other direction, which is different from the first and second directions D1 and D2. In some embodiments, the enclosing portions P formed by the grooves G on the bottom surface 36B of the top layer 36 are square, diamond-shaped, rectangular, hexagonal, or otherwise polygonal.

Referring to FIG. 8C, the bottom surface 36B of the (circular) top layer 36 includes a central region R1 (depicted as a dashed line) and an edge region R2 surrounding the central region R1. The grooves G are evenly distributed in the central region R1. More specifically, the grooves G include multiple first grooves G1, multiple second grooves G2, and multiple third grooves G3. The first grooves G1 are arranged in concentric circles. In accordance with some embodiments, the number of first grooves G1 is three (FIG. 8C) or more than three. The distances between the first grooves G1 are substantially the same. The second grooves G2 are arranged radially and pass through the center O of the concentric circles (the first grooves G1). In accordance with some embodiments, the number of second grooves G2 is three (FIG. 8C) or more than three. The angles between the second grooves G2 are substantially the same. The third grooves G3 are arranged radially, between the second grooves G2, and extending from the inner first grooves G1 to the outer first grooves G1. In accordance with some embodiments, the number of third grooves G3 is three (FIG. 8C) or more than three. In addition, the distribution density of the third grooves G3 located on the outer side of the central region R1 is higher than the distribution density of the third grooves G3 located on the inner side of the central region R1.

With the above arrangement, the bottom surface 36B of the top layer 36 is separated into multiple portions P by the grooves G, and hence the top layer 36 is broken into multiple individual, connected islands 36C (FIG. 7). The portions P of the bottom surface 36B correspond to the islands 36C. In addition, in the central region R1 of the bottom surface 36B, the grooves G form multiple enclosing portions P with a sector or fan shape and having substantially the same dimensions, so that the islands 36C (FIG. 7) of the top layer 36 may also have the same stiffness. Accordingly, the removal rate uniformity of the whole wafer 24 (FIG. 7) using the polishing pad 14 in FIG. 8C is improved.

Furthermore, as shown in FIG. 8C, the grooves G terminating before the periphery 36D of the bottom surface 36B can keep liquid (for example, the slurry) out of the interface between the top layer 36 and the base layer 34 (FIG. 7), and hence the quality and lifespan of the polishing pad 14 are maintained.

Figure 9:
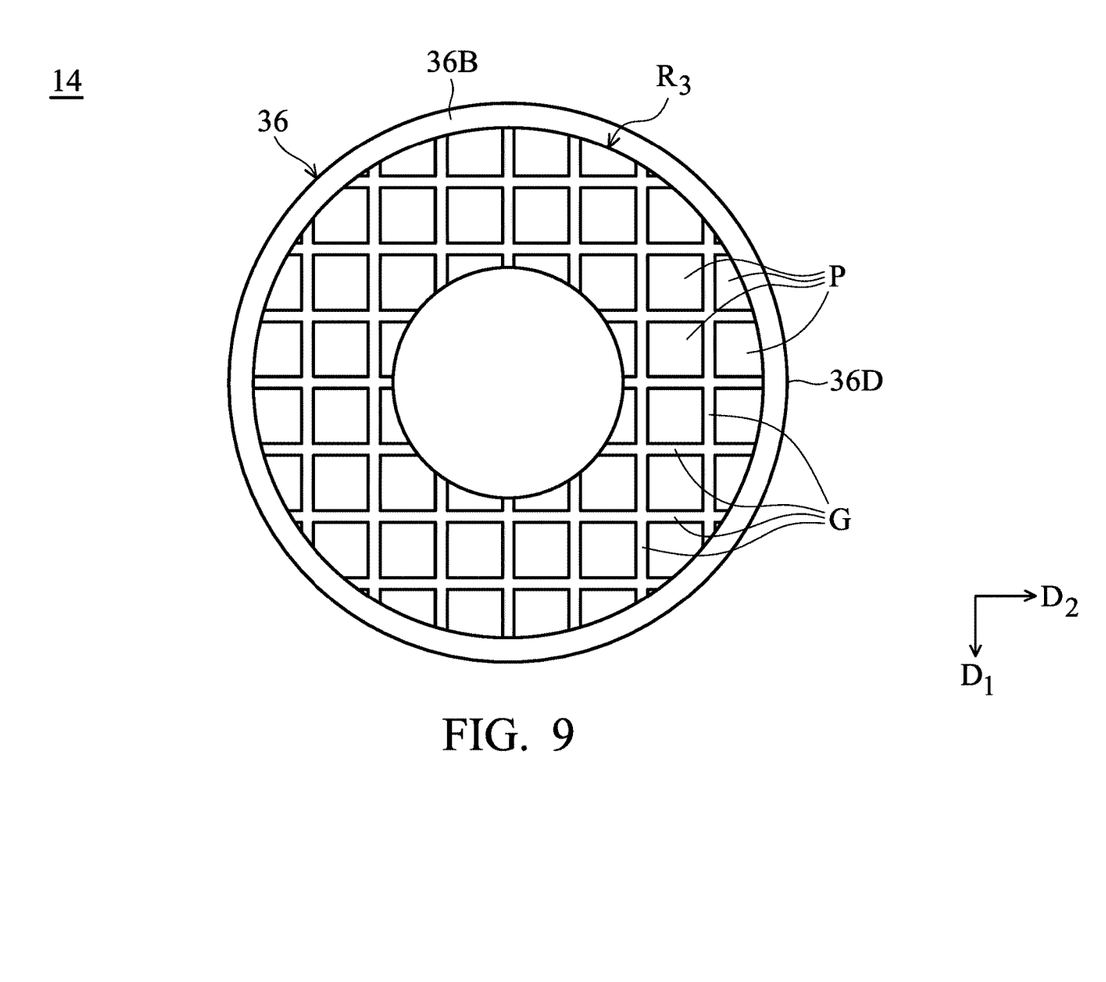
FIG. 9 is a plane view illustrating that the grooves are distributed in an annular region in the bottom surface of the top layer of a polishing pad in accordance with some embodiments.

FIG. 9 is a plane view illustrating that the grooves G are distributed in an annular region R3 in the bottom surface 36B of the top layer 36 of a polishing pad 14 in accordance with some embodiments. As shown in FIG. 9, the grooves G may also be evenly distributed in an annular region R3 of the bottom surface 36B of the top layer 36, rather than being distributed throughout a central region R1 of the bottom surface 36B as shown in FIGS. 8A to 8C. With this arrangement, the removal rate uniformity of the whole wafer 24 (FIG. 7) using the polishing pad 14 in FIG. 9 is also improved, if the wafer 24 is placed on the polishing pad 14 corresponding to the annular region R3 of the top layer 36. Furthermore, the ends of the grooves G are separated from the periphery 36D of the bottom surface 36B by a distance, thereby keeping liquid (for example, the slurry) out of the interface between the top layer 36 and the base layer 34 (FIG. 7), and hence the quality and lifespan of the polishing pad 14 are maintained.

Figure 10:
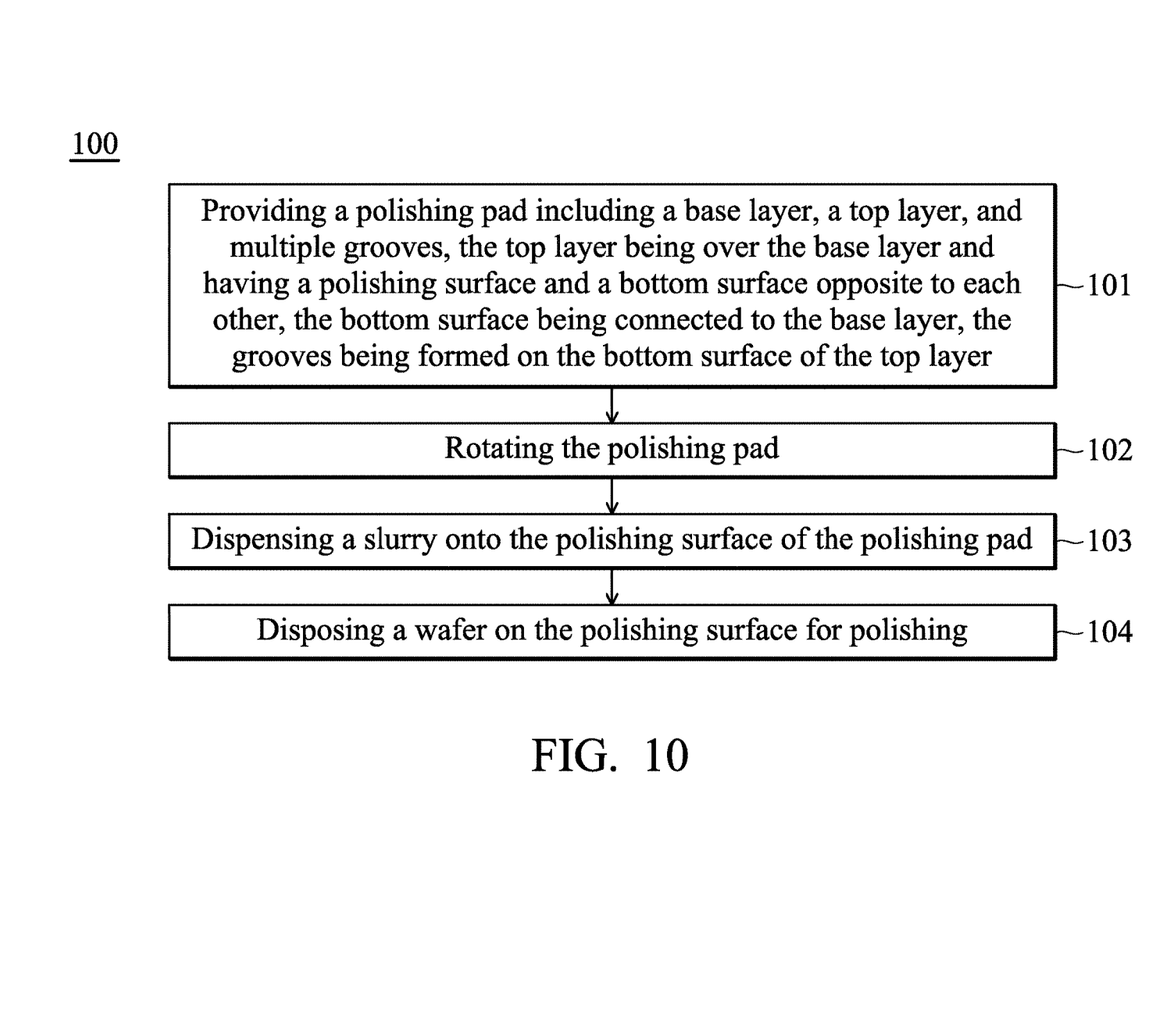
FIG. 10 is a flow chart of a polishing method using a polishing pad in accordance with some embodiments.

FIG. 10 is a flow chart of a polishing/CMP method 100 using a polishing pad in accordance with some embodiments. In step 101, a polishing pad 14 (see also FIG. 6) is provided. The polishing pad 14 includes a base layer 34, a top layer 36, and multiple grooves G. The top layer 36 is located over the base layer 34 and has a polishing surface 36A and a bottom surface 36B opposite to each other. The bottom surface 36B is connected to the base layer 34. The grooves G are formed on the bottom surface 36B of the top layer 36. In step 102, the polishing pad 14 is rotated. In step 103, a slurry 22 is dispensed onto the polishing surface 36A of the polishing pad 14 (see also FIGS. 1 and 6). In step 104, a wafer 24 is disposed on the polishing surface 36A of the polishing pad 14 for polishing (see also FIGS. 5 and 6).

Embodiments of a polishing pad, a CMP apparatus and a CMP method using the polishing pad are provided. The polishing pad includes a base layer, a top layer located over the base layer, and a number of grooves formed on the bottom surface of top layer. The grooves break the top layer into a number of individual, connected islands, so that the stiffness of the whole top layer (and the polishing pad) is reduced while the stiffness of the local islands 36C of the top layer 36 is maintained. Therefore, both the removal rate uniformity and the CMP planarity of the whole wafer 24 using the CMP apparatus and the CMP method are improved. Furthermore, the surface grooves on the polishing surface of the polishing pad are unchanged in the embodiments of the present disclosure, and hence variations in the CMP effect are minimized.

In some embodiments, a polishing pad is provided. The polishing pad includes a base layer, a top layer, and multiple grooves. The top layer is located over the base layer and has a polishing surface and a bottom surface opposite to each other. The bottom surface is connected to the base layer. The grooves are formed on the bottom surface of the top layer.

In some embodiments, a polishing pad is provided. The polishing pad includes a base layer, a top layer, and multiple grooves. The top layer is located over the base layer and has a polishing surface and a bottom surface opposite to each other. The bottom surface is connected to the base layer and includes a central region and an edge region surrounding the central region. The grooves are evenly distributed in the central region, so that the bottom surface of the top layer is separated into a plurality of portions.

In some embodiments, a polishing method is provided. The polishing method includes providing a polishing pad. The polishing pad includes a base layer, a top layer, and multiple grooves. The top layer is located over the base layer and has a polishing surface and a bottom surface opposite to each other. The bottom surface is connected to the base layer. The grooves are formed on the bottom surface of the top layer. The polishing method also includes rotating the polishing pad. The polishing method also includes dispensing a slurry on the polishing surface of the polishing pad. The polishing method also includes disposing a wafer on the polishing surface for polishing.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A polishing pad, comprising:
   a base layer;
   a top layer over the base layer, wherein the top layer has a polishing surface and a bottom surface opposite to each other, and the bottom surface is connected to the base layer; and
   a plurality of grooves formed on the bottom surface of the top layer, wherein ends of the grooves are separated from a periphery of the bottom surface by a distance.

2. The polishing pad as claimed in claim 1, wherein the bottom surface of the top layer is separated into a plurality of portions by the grooves.

3. The polishing pad as claimed in claim 2, wherein the bottom surface of the top layer includes a plurality of enclosing portions formed by the grooves, and dimensions of the enclosing portions are substantially the same.

4. The polishing pad as claimed in claim 1, wherein the bottom surface of the top layer includes a central region and an edge region surrounding the central region, and the grooves are evenly distributed in the central region.

5. The polishing pad as claimed in claim 1, wherein the grooves are evenly distributed in an annular region in the bottom surface of the top layer.

6. The polishing pad as claimed in claim 1, wherein the depth of the grooves is about one half of the thickness of the top layer.

7. The polishing pad as claimed in claim 1, wherein the material of the top layer is harder than that of the base layer.

8. The polishing pad as claimed in claim 7, wherein the top layer comprises a wear-resistant material and the base layer comprises a felt material or a high porosity polymer foam.

9. The polishing pad as claimed in claim 1, further comprising a plurality of surface grooves formed on the polishing surface of the top layer.

10. A polishing pad, comprising:
    a base layer;
    a top layer over the base layer, wherein the top layer has a polishing surface and a bottom surface opposite to each other, and wherein the bottom surface is connected to the base layer and includes a central region and an edge region surrounding the central region; and
    a plurality of grooves evenly distributed in the central region, so that the bottom surface of the top layer is separated into a plurality of portions, wherein ends of the grooves are separated from a periphery of the bottom surface by a distance.

11. The polishing pad as claimed in claim 10, wherein the bottom surface of the top layer includes a plurality of enclosing portions formed by the grooves, and dimensions of the enclosing portions are substantially the same.

12. The polishing pad as claimed in claim 10, wherein the top layer is circular, and the length of the grooves is less than the diameter of the top layer.

13. The polishing pad as claimed in claim 10, wherein the grooves comprise a plurality of first grooves extending in a first direction and a plurality of second grooves extending in a second direction that is different from the first direction.

14. The polishing pad as claimed in claim 13, wherein the first grooves and the second grooves cross over each other.

15. A polishing pad, comprising:
- a base layer;
- a top layer over the base layer, wherein the top layer has a polishing surface and a bottom surface opposite to each other, and the bottom surface is connected to the base layer; and
- a plurality of grooves formed on the bottom surface of the top layer, wherein the grooves comprise a plurality of first grooves extending in a first direction and a plurality of second grooves extending in a second direction that is different from the first direction, wherein the first grooves and the second grooves intersect, but do not cross over each other.

16. The polishing pad as claimed in claim 10, wherein the grooves comprise a plurality of first grooves arranged in concentric circles, a plurality of second grooves arranged radially and passing through the center of the concentric circles, and a plurality of third grooves arranged radially, between the second grooves, and extending from the inner first grooves to the outer first grooves.

17. The polishing pad as claimed in claim 16, wherein the distribution density of the third grooves located on the outer side of the central region is higher than the distribution density of the third grooves located on the inner side of the central region.

18. The polishing pad as claimed in claim 16, wherein the portions formed by the grooves have a sector or fan shape and dimensions of the portions are substantially the same.

19. The polishing pad as claimed in claim 15, wherein ends of the first grooves and ends of the second grooves are separated from a periphery of the bottom surface by a distance.

20. The polishing pad as claimed in claim 15, wherein the bottom surface of the top layer includes a central region and an edge region surrounding the central region, and the first grooves and the second grooves are evenly distributed in the central region.

* * * * *